United States Patent [19]

Cole et al.

[11] 4,246,597
[45] Jan. 20, 1981

[54] AIR COOLED MULTI-CHIP MODULE HAVING A HEAT CONDUCTIVE PISTON SPRING LOADED AGAINST THE CHIPS

[75] Inventors: Allan S. Cole; Omkarnath R. Gupta, both of Boca Raton, Fla.

[73] Assignee: International Business Machines Corporation, Armonk, N.Y.

[21] Appl. No.: 53,679

[22] Filed: Jun. 29, 1979

[51] Int. Cl.³ .................... H01L 23/02; H01L 23/16; H01L 23/42
[52] U.S. Cl. ........................... 357/81; 357/79; 357/75; 165/80 D
[58] Field of Search .................. 357/75, 79, 81, 82; 165/80

[56] References Cited

U.S. PATENT DOCUMENTS

| 3,719,862 | 3/1973 | Gaicki | 357/81 |
| 3,723,836 | 3/1973 | Shekerjian | 357/81 |
| 3,972,012 | 7/1976 | Liu | 357/81 |
| 4,067,042 | 1/1978 | Novak et al. | 357/82 |
| 4,167,771 | 9/1979 | Simons | 165/80 |
| 4,203,129 | 5/1980 | Oktay et al. | 357/82 |

OTHER PUBLICATIONS

IBM Technical Disclosure Bulletin; Cooling Assembly for Integrated Circuit Chip by Lynch, vol. 20, No. 1, Jun. 1977, p. 143.

*Primary Examiner*—Andrew J. James
*Attorney, Agent, or Firm*—Douglas R. McKechnie

[57] ABSTRACT

A multi-chip module is provided having one or more cylinders formed in the module cap, each centered over the middle chip of a group of chips. Cooling fins are attached to and extend from each of the cylinders. A heat conductive piston is located in each of the cylinders forming a small interface between the piston and the cylinders and the piston and the middle chip. The heat conductive piston is spring loaded against the chips. A heat conductive conformal surface flange extends radially from the outer end of each of the pistons so as to have portions thereof contacting adjacent chips in the group of chips, thereby providing parallel conduction cooling from the adjacent chips to the central heat conductive piston. Heat conductive spring means are included between the module caps and the flange for providing a seating force of the flange against the chips and providing an additional heat transfer path from the chip.

9 Claims, 5 Drawing Figures

AIR COOLED MULTI-CHIP MODULE HAVING A HEAT CONDUCTIVE PISTON SPRING LOADED AGAINST THE CHIPS

DESCRIPTION

Technical Field

This invention relates to a multi-chip module cooling structure, and pertains more particularly to a multi-chip module which is adapted for air cooling and which provides a temperature averaging effect at the chips.

One object of the present invention is to provide an air cooled multi-chip module which has sufficient fin area to provide the required cooling without increasing the overall module dimensions.

Another object of the present invention is to provide an air cooled multi-chip module in which the chips are maintained at an average temperature.

Another object of the present invention is to provide an air cooled multi-chip module in which the chip to conductive surface contact interface is maintained at a low thermal resistance regardless of the chip tilt.

It is another object of the present invention to provide an air cooled multi-chip module in which an additional heat transfer path including a spring loading means is provided for each chip.

It is another object of the present invention to provide an air cooled multi-chip module in which cooling is provided for groups of chips in the multi-chip arrangement.

It is another object of the present invention to provide a simple inexpensive structure for an air cooled multi-chip module which provides parallel conduction thermal paths to a common conduction piston heat removal path which provides in combination a temperature averaging at the chips and a low impedance to air cooling.

Citation of the Prior Art

With the miniaturized capabilities afforded by the discovery of solid state electronics, various improved means of dissipating the heat generated by solid state components have been investigated. For example, especially in connection with large scale computer systems, a gas encapsulated cooling module, U.S. Pat. No. 3,993,123, issued Nov. 23, 1976, has been devised, wherein an encapsulated cooling unit or module is provided, which utilizes inert gas having good thermal conductivity as the encapsulated medium in combination with a conductive heat transfer arrangement. The conductive heat transfer arrangement consists of heat transfer pistons, one for each chip in the module, which fit into cylindrical openings in the housing, and are spring biased against the chips. The ultimate heat sink can be water, which is attached to the housing in the form of a cold plate, or the housing can have large fins extending therefrom over which air is blown.

The adding of fins of sufficient size to provide the required cooling considerably increases the size of the module. Redesigning the module to reduce the housing area by forming the housing surface so that it contains the cylinders, and attaching fins to the cylinders introduces impedance to the air flow because of the large number of cylinders and limits the fin surface area.

Lower power chips when placed in the above described module do not operate within their required characteristic range. Because of the high heat dissipating quality of the module, the low power chips tend to run cold, that is, they never reach their required operating temperature. Various means of compensating for this problem have been introduced. For example, U.S. Patent Application Ser. No. 807,096, filed June 16, 1977, sets forth a thermal interface adapter which is located in the interface between the housing and the heat sink of a conduction cooling module. The thermal interface adapter creates a thermal resistance in the heat transfer path of the low power chips, thereby providing a higher operating temperature for these chips.

U.S. Pat. No. 4,153,107 issued May 8, 1979 discloses a temperature equalizing element for a conduction cooling module, which consists of a cut-out portion in the piston which introduces an increase in resistance in the heat path in which it is included. These elements are included in the heat path of the lower power chips which allows the low power chips to run hotter and get up to temperature faster. These arrangements do not provide the desired averaging of the temperature of the chips nor do they simplify the structure so that air cooling can be utilized without increasing the size of the package.

SUMMARY OF THE INVENTION

The above problems in the prior art were solved by the present invention wherein the conduction cooling module was redesigned to be simple and inexpensive and to operate in conjunction with air cooling. The module is of the type having a plurality of chips mounted face down to a substrate, and in which the module cap is connected at the edges thereof to the substrate. One or more cylinders are formed in the module cap, each centered over the middle chip of a group of chips. Cooling fins are attached to and extend from each of the cylinders. A heat conductive piston is located in each of the cylinders forming a small interface between the piston and the cylinder and the piston and the middle chip. A spring member forces the heat conduction piston against the abutting chip. A heat conductive conformal surface flange extends radially from the outer end of each piston so as to have the chip facing surface thereof, contacting the exposed surface of the adjacent chips in the group of chips, thereby providing parallel conduction cooling from said adjacent chips to said central heat conductive piston. Slots, located between the adjacent chips in the group of chips, extend into the flange from the outer edge thereof, forming a flexible contact member in the conformal surface flange for making good surface contact with the adjacent chips regardless of any tilt thereof. A heat conductive spring means is connected between the module cap and each contact element of the flange for providing a seating force of the contact element against the adjacent chip surface, and also providing an alternate heat transfer path from the chip.

BRIEF DESCRIPTION OF THE DRAWINGS

In the accompanying drawings forming a material part of this disclosure.

DISCLOSURE OF THE INVENTION

Figure 1:
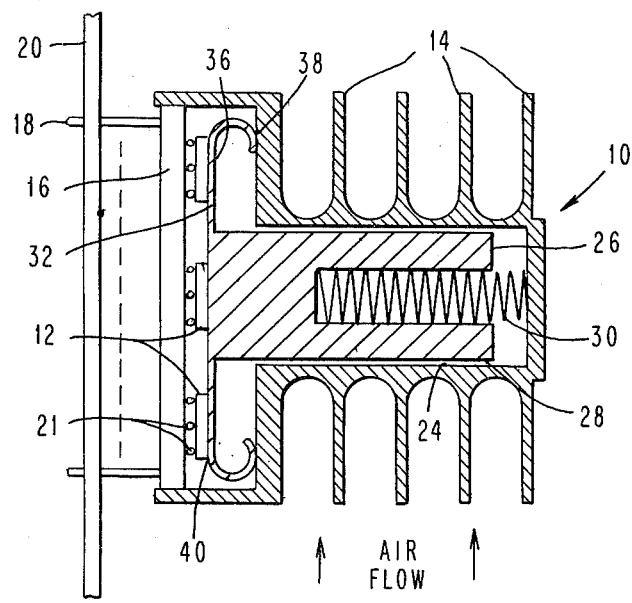
FIG. 1 is a partially cross-sectioned schematic diagram of an air cooled multi-chip module.

For further comprehension of the invention, and of the objects and advantages thereof, reference will be had to the following description and accompanying drawings, and to the appended claims in which the various novel features of the invention are more particularly set forth.

The air cooled multi-chip module 10 provides an arrangement for cooling a group of chips 12 by thermal conduction. The heat is conducted to a fin arrangement 14 which is cooled by forced air blown across the fins. The module 10 consists of a substrate 16 having a number of pins 18 extending from one side thereof to connect the module to a circuit card or board 20. The inner side of the substrate 16 has a number of chips 12 located thereon, mounted in a face down orientation. That is, the chip surface containing the circuits is mounted face down to the substrate via solder ball 21 connections. A housing or cap 22 is provided which is attached at the edges thereof to the substrate 16, and which has a cylinder 24 formed in the cap. A heat conductive piston 26 is located within the cylinder forming a small gap 28 with the inner cylinder walls. The heat conductive piston 26 is spring loaded by means of a spring 30 located in a spring retainer opening in the heat conductive piston. The spring 30 provides a force to the heat conductive piston 26, which presses against the center chip of the group of chips 12 making good heat conductive contact therewith. The bottom of the piston 26 is formed into a flange 32 or has a flange attached thereto. The flange 32 is made of a flexible material such as copper, aluminum or a combination of heat conductive materials, and is sufficiently thin to be readily flexible. The flange 32 may be square or round, see FIGS. 2 and 3, respectively. In the case of the square flange 32, it is wide enough to encompass or lay over the exposed surfaces of the adjacent chips 12. The circular flange 32 has the advantage that it can be inserted without being correctly oriented, as in the case of the square flange. The circular flange has the disadvantage that it may require more room than that required by the square flange.

The problem encountered, with what are popularly known as "flip chips", is that the solder ball 21 mounting often results in slightly tilted chips 12. In order to obtain a good heat transfer from the exposed surface of the chip 12, it is necessary to obtain as much surface contact with the chip surface as possible by the heat removal element. In most cases, the heat removal element will have a flat surface, which when abutted to the exposed chip surface will meet in a line or a point, because of the tilt of the chip. This problem is solved in the present invention by the conformal surface flange 32 which is sufficiently flexible to adapt to any chip 12 tilt. The conformal surface contact area of the flange 32 is formed by cutting slots 34 in the flange 32 in the area which lies between chips 12. These slots 34 can best be seen in FIG. 2, and are limited in width to the distance between chips 12. The conformal surface contacts, with the slots 37 in the flange surface, appear to be extensions 36 of the flange 32. These slots 34 free the contact area and give it more flexibility to seat itself against the chip 12 surface. The extensions 36 or conformal surface contacts have an upward curved portion 38 at the ends thereof. These curved ends 38 are made of a resilient material, and when inserted in the module 10 contact the inner side of the cap 22 as can be seen in FIG. 1. This resilient material exerts a force pressing the conformal surface contact 36 against the chip 12 surface. This ensures good surface contact between the mating surfaces forming the interface 40.

Figure 2:
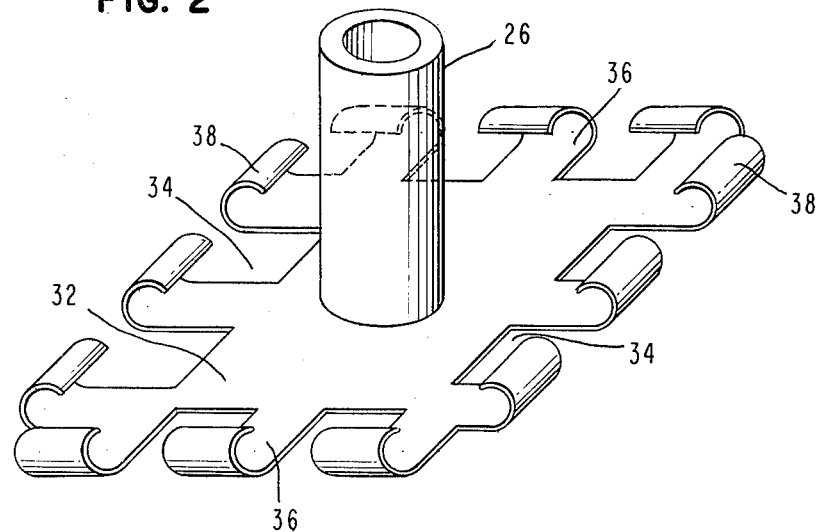
FIG. 2 is a schematic isometric view showing the heat conductive piston and the conformal surface flange utilized in FIG. 1.
Figure 3:
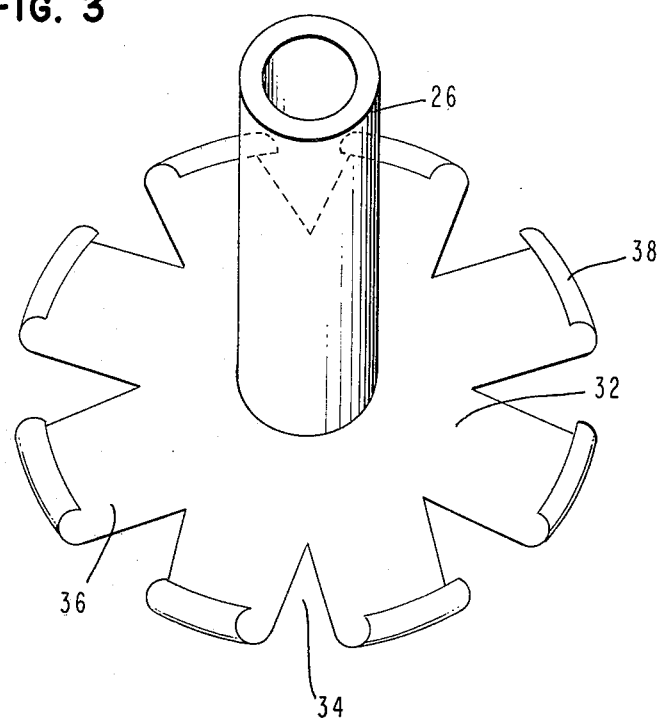
FIG. 3 is a schematic isometric view of the heat conductive piston and a circular conformal surface flange.

It should be appreciated from FIGS. 1 and 2, that the flange 32 extends in all directions from the central heat conductive piston 26 contacting all the adjacent chips 12. The cylinder 24 is circular and the cap 22 is square encompassing a 3 by 3 array of chips.

Various spring loading means could be used in place of the curved portions 38 or springlets at the end of the extensions 36. For example, a spring loaded plate biasing the conformal surfaces against the chip surface could be used.

Figure 4:
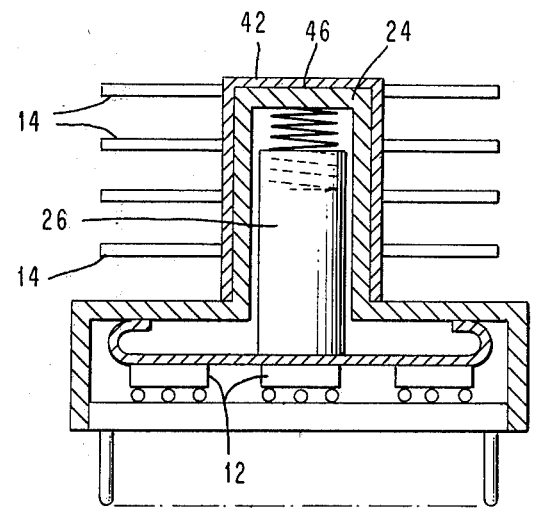
FIG. 4 is a partially cross-sectioned schematic diagram of an air cooled module having a finned sleeve fitted over the cylinder.

As can be seen in FIG. 1, the fins 14 can be molded as part of the cap 22. The cylinder 24 and the heat conducting piston 26 can be elongated and the number of fins 14 increased accordingly, to increase the heat dissipation required for the particular chips. The fins 14 can be added to the cylinder 24 in the form of a sleeve 42, see FIG. 4, which fits over the cylinder 24 of the cap 22 or housing and carries the necessary fins 14 therewith. It should be appreciated that the fin-sleeve 42 may not be as efficient as forming the fins 14 in the cylinder 24, since another interface 46 is introduced between the outside of the cylinder 24 and the sleeve 42. This interface 46, of course, introduces a further thermal resistance which effects the heat transfer.

Figure 5:
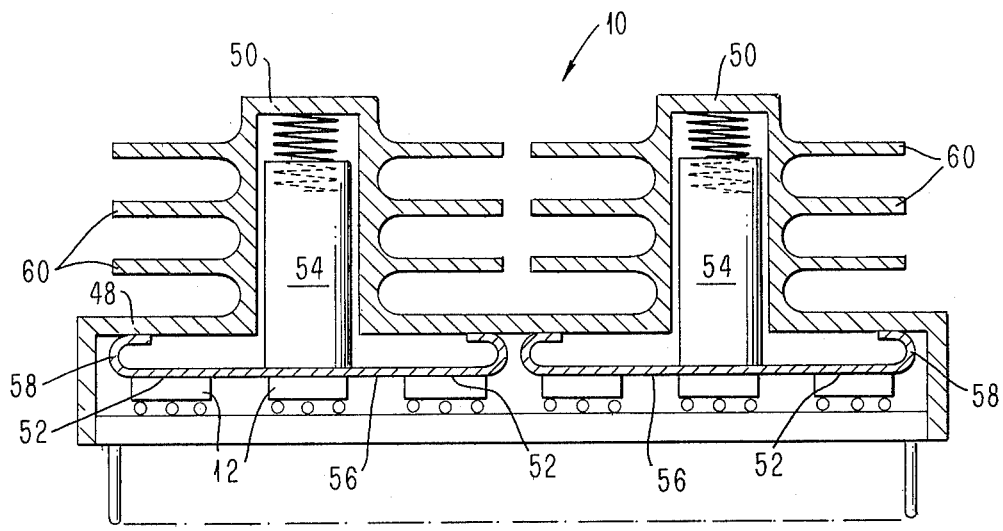
FIG. 5 is a partially cross-sectioned schematic diagrm of an air cooled multi-chip module for multi groups of chips.

The air cooled multi-chip module 10 can be extended to provide the heat removal from a larger number of chips 12 than shown in FIG. 1. For example, FIG. 5 shows a module 10 incorporating the present invention associated with a 6 by 6 array of chips 12. The cap or housing 48 in this arrangement contains a plurality of cylinders 50 one over each of the middle chips of a group of chips 12. The conformal surface contacts 52 extend over the eight adjacent chips in each group. In a 6 by 6 array of chips 12, the central piston 54 would be located over the middle chip in each quadrant of nine chips. As was previously described, the conformal surface flange 56 extends at right angles from the bottom of the heat conductive piston 54 and is spring biased against the adjacent chips 12 by the springlet or spring means 58 formed at the ends of the extensions 52 of the flange 56. This arrangement gives sufficient fin 60 surface area for the required heat transfer from the chips 12. If it was attempted to provide a separate heat conductive piston for each of the chips 12, as was done in the prior art, the surface area for the fins would be severely diminished and the cylinders themselves would act as impedances to the air flow. It should be appreciated that a cross-sectional view looking in at the side of piston 54, in FIG. 5, would result in a diagram the same as FIG. 5, indicating that the module is symmetrical to contain the 6 by 6 array of chips.

The heat transfer from the module 10, FIG. 1, can be enhanced by extending the cylinder 24 and piston 26 located therein so that there is more space available for fins 14. In other words, more fins 14 can be added to the elongated cylinder 24 to increase the heat transfer, if required. The internal portion of the module 10 can have the heat transfer enhanced by utilizing the various known techniques, such as using thermal grease in the interfaces. For example, the interface 28 between the piston and the cylinder can be filled with thermal grease, thereby reducing the resistance of the interface. Similarly, the interfaces 40 between the chips 12 and the overlying conductive surfaces, such as the conformal contact surfaces 36, can have thermal grease added thereto. Also, the entire interior of the housing 22 can be filled with a fluid such as helium gas which fills the interface and lowers the thermal resistance thereof.

In operation, the main heat transfer path is from the circuitry on the chips 12, across the interfaces 40 between the chips 12 and the conformal surface contacts 36, along the flange 32 to the common heat conductive piston 26. In the case of the center chip of the group, the path is across the interface 40 directly into the piston 26. The path continues from the heat conductive piston 26 across the interface 28 between the piston 26 and the cylinder 24 and from the cyliner 24 into the cooling fins 14. Forced air is blown over the cooling fins 14 to absorb the heat therefrom. A further heat transfer path exists from the conformal surface contact 36 along the springlet 38 and across the interface between the touching portion of the springlet 38 and the can 22. The path continues along the can 22 to the heat dissipating fins 14. There is some heat transfer from the chips 12 through the solder balls 21 into the substrate 16, and from the substrate 16 into the can 22 and eventually to the fins 14. The utilization of the common thermal conductive piston 26 for the heat transfer of the group of chips 12 tends to average the heat removal from the involved chips thus bringing them to an average temperature. The construction using the single thermal conductive piston 26 and the flange 32 in lieu of a separate piston for each of the chips provides a considerable simplification and savings in each module.

While we have illustrated and described preferred embodiments of our invention, it is to be understood that we do not limit ourselves to the precises construction herein disclosed and the right is reserved to all changes and modifications coming within the scope of the invention as defined in the appended claims.

Having thus described our invention, what we claim as new, and desire to secure by Letters Patent is:

1. A module having a plurality of chips mounted face down to a substrate comprising;
    a module cap connected at the edges thereof to said substrate;
    one or more cylinders formed in said module cap, each centered over the middle chip of a group of chips;
    cooling fins extending from each of said cylinders;
    a heat conductive piston located in each of said cylinders forming a small interface between said piston and said cylinders and said piston and said middle chip;
    a spring member forcing said heat conductive piston against said middle chip;
    a heat conductive conformal surface flange extending radially from the outer end of each of said pistons so as to have the bottom surface thereof, contacting the exposed surface of said adjacent chips in said group of chips thereby providing parallel conduction cooling from said adjacent chips to said central heat conductive piston;
    slots located between said adjacent chips in said group of chips extending into said flange from the outer edge thereof forming a flexible contact member in said conformal surface flange for making good surface contact with said adjacent chips regardless of any tilt thereof; and
    heat conductive spring means connected between said module cap and said contact elements of said flange for providing a seating force against said contact element and providing an additional heat transfer path from the chip.

2. In a module according to claim 1, wherein said heat conductive conformal flange is made of a thin sheet of copper or aluminum which is sufficiently thin to be flexible.

3. A module according to claim 1, wherein said flange has a square shape and is large enough to cover all of the chips of said group of chips.

4. A module according to claim 1, wherein said heat conductive conformal surface flange is circular in shape and has sufficient radius to encompass all the chips in said group of chips.

5. A module according to claim 1, wherein said spring means consists of curved extensions extending from the end of the contact element formed in said conformal surface flange forming a springlet which contacts the cap and biases the contact element against the chip surface.

6. A module according to claim 5, wherein said conformal surface flange and said extension member are made of a good heat conductive spring metal.

7. A module according to claim 1, wherein said cooling fins are formed as part of said cap.

8. A module according to claim 1, wherein said cooling fins extend from a sleeve which is placed over said cap cylinder.

9. A module according to claim 1, wherein the interface between said pistons and said cylinders and said piston and said middle chip and said conformal surface contact member and said adjacent chips are filled with a high heat conductive fluid such as thermal grease or helium.

* * * * *